United States Patent [19]

Hermeling, Jr. et al.

[11] Patent Number: 4,499,602
[45] Date of Patent: Feb. 12, 1985

[54] DOUBLE CONVERSION TUNER FOR BROADCAST AND CABLE TELEVISION CHANNELS

[75] Inventors: Gilbert C. Hermeling, Jr.; Max W. Muterspaugh, both of Indianapolis, Ind.

[73] Assignee: RCA Corporation, New York, N.Y.

[21] Appl. No.: 508,595

[22] Filed: Jun. 28, 1983

[51] Int. Cl.³ .............................................. H04B 1/26
[52] U.S. Cl. .................... 455/180; 455/189; 455/190; 455/315
[58] Field of Search ............... 455/131, 180, 189–191, 455/314, 315, 197; 358/191.1

[56] References Cited

U.S. PATENT DOCUMENTS

| 3,555,430 | 1/1971 | Fischer et al. |
| 3,696,302 | 10/1972 | Gossard |
| 3,939,429 | 2/1976 | Lohn et al. |
| 4,214,212 | 7/1980 | Dipietromaria ............ 455/315 |
| 4,322,856 | 3/1982 | Ohta et al. ............ 455/189 |
| 4,340,975 | 7/1982 | Onishi et al. ............ 455/315 |
| 4,352,209 | 9/1982 | Ma |
| 4,353,132 | 10/1982 | Saitoh et al. |
| 4,402,089 | 8/1983 | Knight et al. ............ 455/197 |
| 4,408,348 | 10/1983 | Theriault ............ 455/190 |

OTHER PUBLICATIONS

Performance Spec. for: 54 Channel CATV Converter RF Module Stancomp, Inc.—Jun. 1980.
"Past, Present and Future Trends of TV Tuner Design in Europe", IEEE Trans. on Consumer Electronics, J. Schuermann, May 1977.

*Primary Examiner*—Jin F. Ng
*Attorney, Agent, or Firm*—Eugene M. Whitacre; Paul J. Rasmussen; Peter M. Emanuel

[57] ABSTRACT

In a double conversion tuner intended to tune UHF broadcast channels as well as VHF broadcast and cable channels, the frequency range of the first intermediate signal produced by the first mixer is selected to correspond to that of UHF channel 37. The frequency range of UHF channel 37 is reserved for radio astronomy and is, therefore, not used for the broadcast of television information. The tuner includes provisions for inhibiting interference from the RF signals corresponding to channels 36 and 38 which are adjacent to channel 37 and which are used for the broadcast of television information.

20 Claims, 5 Drawing Figures

DOUBLE CONVERSION TUNER FOR BROADCAST AND CABLE TELEVISION CHANNELS

The present invention concerns double conversion tuning systems for television receivers.

In a double conversion tuning system, the RF signal for the selected channel is converted (or heterodyned) by a first mixer to a first intermediate signal and the first intermediate signal is converted by a second mixer to a second intermediate signal. The second intermediate signal is in a predetermined IF frequency range, typically the same as the IF signal produced by a conventional signal conversion tuning system. A first local oscillator signal is generated for the first mixer by a first local oscillator and has its frequency controlled in accordance with the channel selected by a user so that the frequency of the first intermediate signal falls within a predetermined frequency range which is selected to reduce interference signals. A second local oscillator signal is generated for the second mixer and has its frequency set so that the second intermediate signal is in the desired IF frequency range. In a television receiver intended for use in the United States, the frequency of the second local oscillator signal is selected so that the picture and sound carriers of the RF signal for the selected channel are converted to 45.75 mHz and 41.25 mHz, respectively.

Double conversion tuning systems have been proposed for television receivers because they have been found to overcome the shortcomings of single conversion tuning systems which limit the number of UHF channels which can be utilized in a given area once one UHF channel has been assigned. Specifically, it has been found that by selecting the frequency range of the first intermediate signal (often called first IF signal even though it is not actually in the IF frequency range) as high as possible, the number of the interference signals which limit the number of useful UHF channels in a given area are reduced. The selection of the frequency range of the first intermediate signal is limited by the operating frequency range of components of the tuning system which are inexpensive enough to be used in a consumer electronics product. As a practical matter, since it is not reasonable to select the frequency range of the first intermediate signal at the location of an active channel, it has been proposed to select the frequency range of the first intermediate signal between the VHF and UHF frequency ranges. For example, in the United States a suitable choice for the first intermediate signal is between 216 mHz (the upper frequency limit for broadcast channel 13) and 470 mHz (the lower frequency limit for broadcast channel 14).

With the ever increasing popularity of cable television, television receiver manufacturers have begun to provide so-called "cable ready" television tuners which are capable of tuning cable channels as well as broadcast. Cable channels are VHF channels between the low VHF band (channels 2-6) and the high VHF band (channels 7-13) and between the high VHF band and the UHF range. The frequency of the highest cable channel is just below the lowest UHF channel. This presents a problem in selecting the frequency of the first intermediate signal between the VHF and UHF in order to permit the more full allocation of UHF channels in a given area as described above.

In accordance with the present invention, in a double conversion television tuning system capable of tuning VHF and UHF broadcast channels and possibly cable channels as well, the frequency range of the first intermediate signal is selected to be within the UHF range but at a channel not used for the transmission of television signals. Specifically, the frequency range between 608 and 614 mHz, inclusively, which corresponds to UHF channel 37 in the United States, has been reserved for radio astronomy and is, therefore, not used for television transmission has been found to be a suitable frequency range for the first intermediate signal. While the frequency of the first intermediate signal used in so-called "set-top" cable tuners has for some time been in the frequency range between 608 and 614 mHz (most often around 612 mHz) to avoid the generation of undesired signals which interfere with the tuning of cable channels, such cable tuners are not intended to and cannot tune broadcast UHF channels. Although the frequency range of UHF television channel 37 is not used for the transmission of television information, it was previously thought to be an unreasonable selection for use as the frequency range for the first intermediate signal of a tuner intended to tune UHF broadcast channels, because of the possibility of the presence of RF signals for UHF channels 36 and 38 adjacent to channel 37 and used for the broadcast of television information. It was thought that the presence of strong RF signals at either of channels 36 or 38 would significantly interfere with the tuning of other UHF channels if the frequency range of channel 37 was selected as the frequency range of the first intermediate signal of a double conversion tuner intended to tune UHF channels. Surprisingly, however, field tests showed that a double conversion tuner with a first intermediate signal in the frequency range between 608 and 614 mHz, inclusively, worked very well to tune VHF and UHF broadcast channels as well as cable channels, especially if other features were employed.

In accordance with a further feature of the present invention, it has been found preferrable that the first mixer be a doubly balanced mixer. A doubly balanced mixer has the property of producing an output signal which is relatively free of components at the frequencies of the input signals. This is of significant benefit in the present invention because of the possibility of strong RF signals for the channels (e.g., 36 and 38) adjacent to the one corresponding to the first intermediate signal.

In accordance with still another feature of the present invention, the frequency of the first local oscillator signal is controlled in accordance with the selected channel to place the picture carrier of the first intermediate signal corresponding to the selected channel at 612.75 mHz. This has the effect of putting the energy associated with the side bands of the picture carrier of the upper adjacent channel (e.g., 38) outside the passband of the second or conventional IF filter section. To reject the sound carrier of lower adjacent channel 36, a trap may be provided at the difference between the frequency (in the RF range) of the sound carrier of lower adjacent channel (e.g., 36) and the frequency of the second local oscillator signal and/or selectively at the frequency (in the RF range) of the sound carrier of the lower adjacent channel (e.g., 36). The latter trap is removed when the lower adjacent channel (e.g., 36) is selected for tuning.

These and other features of the present invention will be described with reference to the accompanying drawing in which.

Figure 1:
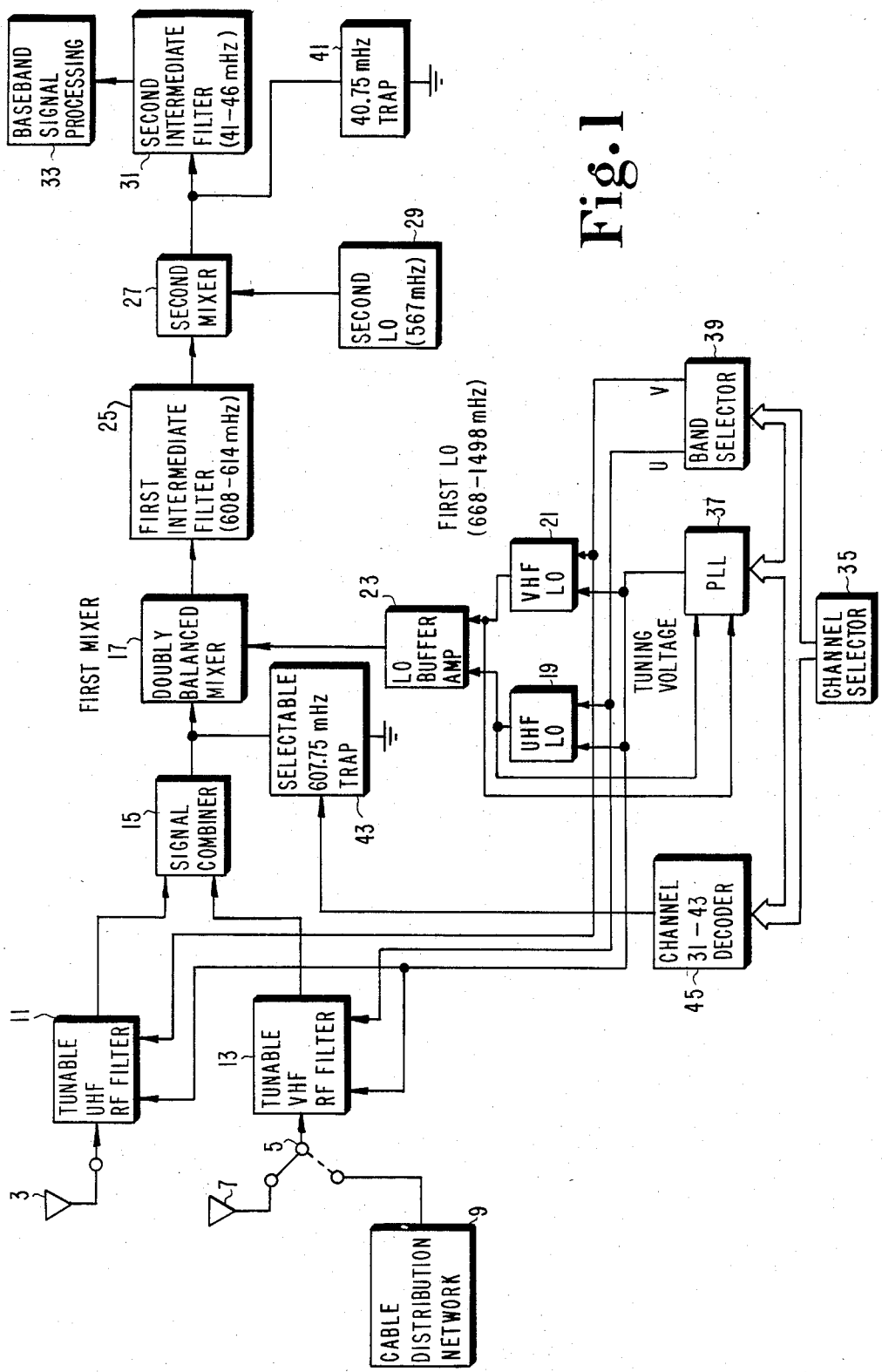
FIG. 1 is a schematic in block diagram form of the preferred embodiment of a double conversion television tuner constructed according to the present invention.

The double conversion tuning system of the television receiver shown in FIG. 1 includes a UHF input 1 which is intended to be connected by a user to a UHF antenna 3 external to the receiver and a VHF input 5 which is intended to be connected by the user to either a VHF antenna 7 or a cable distribution network 9. When a UHF broadcast channel is selected by the user, a tunable UHF RF filter stage 11 is enabled to respond to a tuning voltage to select the particular UHF RF signal corresponding to the selected UHF broadcast channel from the plurality of UHF RF signals received by UHF antenna 3. When a VHF broadcast or cable channel is selected by the user, a tunable VHF RF filter stage 13 is enabled to respond to the tuning voltage to select the particular VHF RF signal corresponding to the selected VHF broadcast or cable channel from the plurality of VHF RF signals received from either VHF antenna 7 or cable distribution network 9. A signal combiner (or diplexer) 15 couples the selected RF signal from either UHF RF filter 11 or VHF RF filter 13, depending on the particular channel that is selected, to one input of a first mixer 17.

When the selected channel is a UHF channel, a UHF local oscillator (LO) 19 is enabled to oscillate, and when the selected channel is in the VHF broadcast or cable channel a VHF LO 21 is enabled to oscillate. The frequency of oscillation of the enabled one of UHF LO 19 and VHF LO 21 is controlled in response to the tuning voltage. The local oscillator signal produced by the enabled one of local oscillators 19 and 21 is coupled through a buffer amplifier 23 to a second input of mixer 17. Mixer 17 produces at its output signals with frequencies equal to the difference and sum of the frequencies of the selected LO signal and RF signal. The output signals of first mixer are coupled to a first intermediate filter section 25 which has a passband characteristic for passing signals in the frequency range corresponding to the difference frequencies between the LO signal and the various carriers of the RF signal. In accordance with the present invention for the reasons described in detail below, the passband of first intermediate filter Section 25 is selected to include the frequency range between 608 and 614 mHz, inclusively. (The term "first intermediate" is used rather than the more conventional "first IF" because the passband of first intermediate filter 25 is in the UHF frequency range rather than the IF frequency range.) The frequency of oscillation of the enabled one of UHF LO 19 and VHF LO 21 is selected for each channel to place the picture carrier of the first intermediate signal corresponding to the selected channel substantially at 612.75 mHz for the reasons also to be described below. As shown, the frequency range of the first LO signal provided to doubly balance mixer 17 is between 668 mHz and 1498 mHz, inclusively.

The first intermediate signal filtered in first intermediate filter 25 is coupled to one input of a second mixer 27. A second LO signal produced by a second LO 29 is coupled to a second input of second mixer 27. A second intermediate signal, this one actually being within the IF frequency range approximately between 41 and 46 mHz, i.e., the conventional IF frequency range used in the United States, is produced at the output of second mixer 29 as the difference frequency product of the first intermediate signal and the second LO signal. The frequency of second LO 29 is selected at 567 mHz so that the picture carrier of the second intermediate signal corresponding to the selected channel has a frequency substantially equal to 45.75 mHz, i.e., the conventional IF picture carrier frequency in the United States. The second intermediate signal is filtered by a second intermediate signal filter 31 which has an IF passband characteristic (shown in FIG. 2) of conventional IF sections of conventional commercially available television receivers sold in the United States. The filtered second intermediate signal is coupled to a video signal processing section 33 of the television receiver which demodulates its picture, sound and color carriers and thereafter processes the respective baseband responses to produce the visual and audio responses for the selected channel.

The double conversion tuner comprising elements 1–31 so far described is controlled by a control section including a channel selector unit 35 by which a user selects desired channels. Channel selector unit 35 may, e.g., include a calculator-like keyboard by which the user enters the two digit channel number of the desired channel. The channel number, in binary form, is coupled to a tuning voltage generates 37 which generated the tuning voltage and controls its magnitude in accordance with the selected channel. By way of example, as shown, tuning voltage generator 37 may comprise a phase locked loop (PLL) which compares the frequency of the LO signal of the enabled LO to the frequency of a reference frequency signal, derived from the output signal of a crystal oscillator, to generate an error signal which is integrated to form the tuning voltage. The binary form of the channel number is also coupled to a band selector 39 which generates band switching signals (identified as U and V) in accordance with the selected channel to selectively enable the operation of different portions of the double conversion tuner by selectively causing supply voltage to be applied to various sections of the tuner. In addition, since a tunable circuit comprising a fixed configuration of a varactor diode and inductors may not be capable of being tuned over an entire range, band selection signals may be generated by band selector 39 to cause different inductor configurations to be connected in the tunable circuit for different bands of a frequency range (e.g., for the low VHF, midband cable, high VHF bands of the VHF range).

As earlier noted, in accordance to the present invention the frequency range of first intermediate signal extends from 608 mHz to 614 mHz, inclusively. This frequency range, although corresponding to UHF channel 37 in the United States, has been reserved by the Federal Communications Commission in the United States and corresponding authorities in other countries for radio astronomy purposes and, therefore, cannot be used for the broadcast of television information. The relatively high frequency of 608–614 mHz range has significant advantage over others with even higher frequency ranges in reducing the possibility of the generation of interference signals.

With the relatively high frequency range of 608 to 614 mHz for the first intermediate signal, the frequency of unwanted signals, e.g., the RF image and LO signals, for a given channel are far enough above the frequency of the desired RF signal to be easily rejected by tunable RF filter sections 11 and 13. While the same type of unwanted signal rejection could be obtained by selecting a frequency range for the first intermediate signal above the UHF range, such very high frequency selection is not as practical since it requires the use of more expensive components. For example, PLL 37 includes a frequency divider (commonly referred to as a "prescaler") for reducing the frequency of received the LO signal to accomodate the frequency range of the renewing digital components of PLL 37. Using a frequency range above the UHF range for the first intermediate signal requires that the highest LO frequency be above 1800 mHz which approaches the upper operating frequency of presently available prescalers. Using a frequency range, other than 608–614 mHz, below the UHF frequency for the first IF signal means that the frequency range of the first intermediate signal will correspond to an active channel and this results in the generation of interference signals due to the coupling of the RF signal of the active channel to second mixer 27. This is so because the VHF range (approximately between 54 and 469 mHz) is now filled with broadcast VHF channels and either presently active or proposed cable VHF channels. (The highest proposed cable channel identified as W+28, extends approximately between 462 to 469 mHz).

Even though the frequency range for UHF channel 37 has been used as the frequency range of the first intermediate signal in so called "set-top" converters for tuning cable channels, it has heretofore not been proposed for use in a tuner intended to tune broadcast UHF channels. This is so because even though there is no RF television signal for channel 37 and the RF signals for radio astronomy are relatively weak, due to the possible presence of strong RF signals for channels 36 and 38, the generation of corresponding interference signals was anticipated to be highly likely. This is so for the following reasons.

While tunable UHF RF filter 11 is intended to only pass the RF signal for the selected channel, at any given channel its bandwidth is broader than that of the RF signal of the selected channel and therefore it cannot restrict reception to only the RF signal of the selected channel. Furthermore, first intermediate filter 23 has a passband of greater than 7 mHz. Therefore, it was reasonable to believe that the RF signals for channels 36 and 38 adjacent to channel 37 could be coupled to second mixer 27 through UHF RF filter 11 and first intermediate filter 23 and be converted by second mixer 27 to the frequency range of the second intermediate signal and thereby interfere with the tuning of other channels. Thus it appeared that the selection of the frequency range of channel 37 for the first intermediate signal was impractical. Surprisingly, however, field tests have shown that this is not the case, especially when certain structural precautions are taken, as will now be discussed.

To reduce the feedthrough of the RF signals of channels 36 and channel 38, first mixer 17 is preferably a double balanced mixer. Because of its balanced configuration, a doubly balanced mixer has the property of producing at its output substantially only the different and sum frequency products of its two input signals without any significant signal components at the frequencies of its to input signals. Accordingly, if a strong RF signal for either channel 36 or 38 is present when another UHF channel is selected, the output signal of first mixer 17 will contain signal components at the difference and the sum frequency products of the LO signal and the desired RF signal and the difference and sum frequency products of the LO signal of the RF signal for channel 36 or 38. For the most part, only the difference frequency product of the LO signal and the desired RF signal will fall within the passband of first IF filter section 25.

To the extent that the RF signal of channel 38 does get through the doubly balanced mixer comprising first mixer 17 (because its operation varies from the theoretical ideal), the selection of the frequency of the first LO signal at each channel to place the picture carrier of the first intermediate signal corresponding to the picture carrier of selected channel at 612.75 mHz, reduces the interference produced by the RF signal of channel 38 as will now be explained with reference to FIG. 2.

Figure 2:
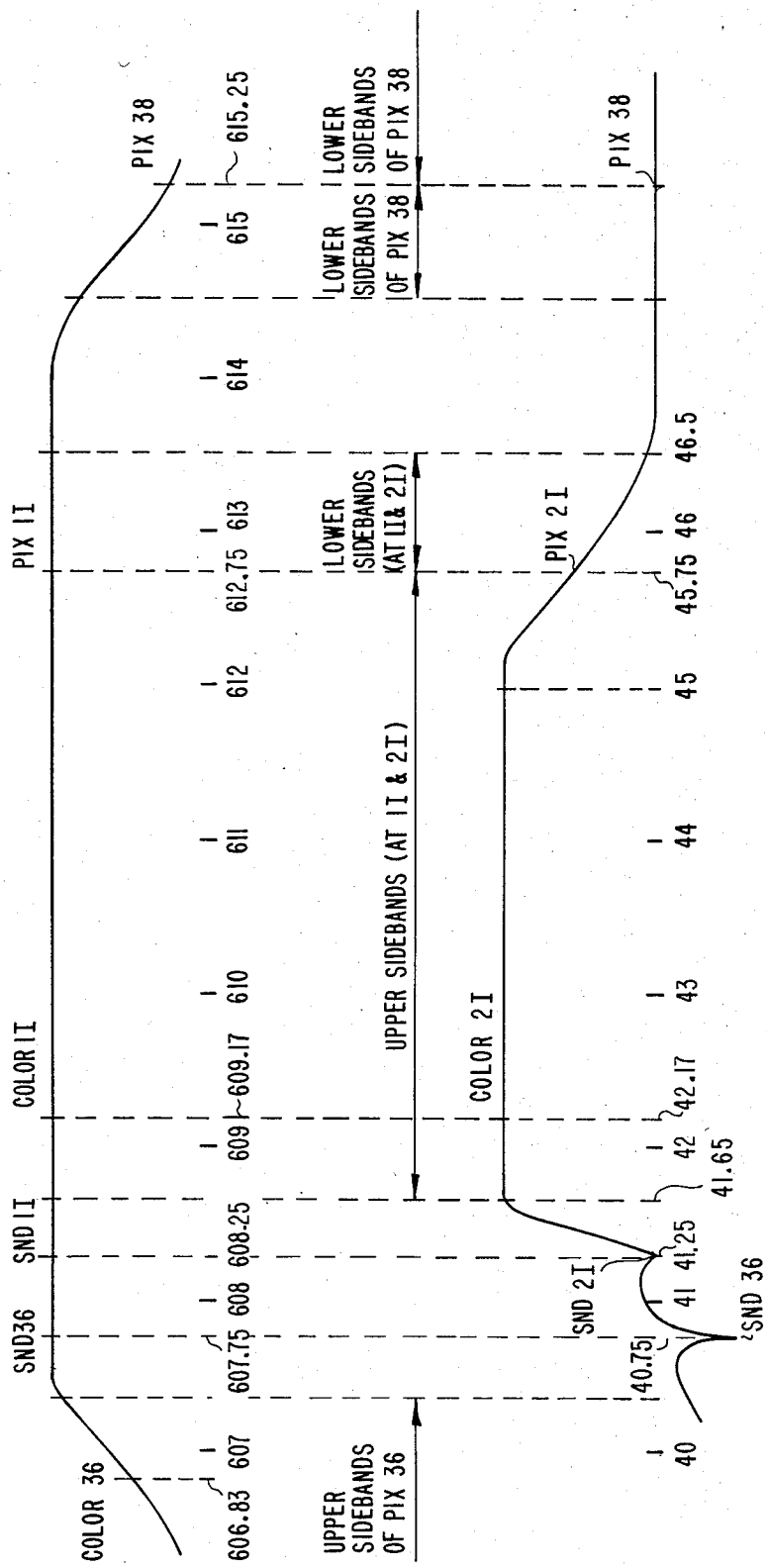
FIG. 2 is a graphical representation of amplitude versus frequency characteristics useful in understanding the embodiment of the invention shown in FIG. 1.

The upper amplitude versus frequency characteristic shown in FIG. 2 shows the location of the RF carriers of channels 36 and 38 with respect to the passband characteristic of first intermediate filter section 25. Because the first intermediate signal is the frequency difference product between the first local oscillator signal and a lower frequency RF signal, the frequencies of the carriers of converted RF signals are inverted with respect to each other in the frequency range of the first intermediate signal, i.e., the picture carrier of the first intermediate signal (PIX 1F) has a higher frequency than the sound carrier (SND 1F). However, since the carriers of the RF signals of channel 36 and 38 are not converted but rather merely fed through mixer 17 (assuming doubly balanced mixer 17 is not ideal), their frequencies are not inverted. The lower amplitude versus frequency characteristic shown in FIG. 2 shows the location of carriers resulting from the conversion of the carriers of the RF signals of channels 36 and 38 fed through first mixer 17 and converted by second mixer 27 to the frequency range of the second intermediate signal. Because the second intermediate signal is the frequency difference product between the first intermediate signal and the lower frequency second LO signal, the frequencies of the carriers of the lower characteristic are not inverted with respect to the carriers shown in the upper characteristic.

While the picture carrier of the RF signal for channel 38 (PIX 38) and its lower sidebands may fall within the passband of first intermediate filter section 25, by shifting or offsetting the location of the picture carrier frequency of the first intermediate signal away from the picture carrier frequency of the RF signal for channel 38 (note that a first cut choice might be 613.75 mHz, the frequency of the sound carrier of the RF signal for channel 37, since the location of picture and sound carriers are inverted by the first conversion process), the frequency range of the picture carrier corresponding to channel 38 and its lower sidebands in the frequency range of the second intermediate signal falls outside the passband of second intermediate filter 31. It has been found that selecting the picture carrier frequency of the first intermediate signal within a range of 2.5 and 2.24 mHz, inclusive, lower than the frequency of the picture carrier of the RF signal corresponding to channel 38, i.e., between 612.75 and 613 mHz, inclusive, produces essentially the same result. The choice of 612.75 mHz is preferrable since at this frequency, the frequency of first the LO signals of first local oscillators 19 and 21 will be integer numbers and, therefore, can readily be synthesized by a PLL comprising tuning voltage generator 37.

Shifting the picture carrier frequency of the first intermediate signal away from the picture carrier frequency of the RF signal for channel 38 shifts it closer to the sound carrier frequency of the RF signal for channel 36. However, as is shown in FIG. 2, the sound carrier corresponding to the sound carrier of the RF signal corresponding to channel 36 (SND 36) as converted to the frequency range of the second intermediate signal is still outside the passband of second intermediate filter 31. When picture carrier frequency of the first intermediate signal is selected as 612.75 mHz, the sound carrier corresponding to channel 36 is located at 40.75 mHz, i.e., 0.5 mHz below the desired frequency of the sound carrier of the second intermediate signal (SND 21) at 41.25 mHz.

Field tests have shown that the tuner performs very well under these conditions. However, to enhance the performance of the tuner, it may be desirable to place a trap for rejecting the sound carrier corresponding to channel 36 in the frequency range of the second intermediate signal in the signal path of second intermediate filter section 31 as is indicated by 40.75 mHz trap 41 connected shunt with the input of second intermediate filter section 31 of the tuner arrangement shown in FIG. 1 and the 40.75 mHz trap response in the lower characteristic of FIG. 2. If the picture carrier frequency of the first intermediate signal is deleted at a value other than 612.75 mHz, the frequency of trap 41 should be accordingly changed. In general, the trap frequency is equal to the sound carrier frequency for channel 36 (607.75 mHz) minus the second LO frequency (e.g., 567 mHz) required to convert the picture carrier frequency of the first intermediate signal to 45.75 mHz.

With respect to the presence of an undesired sound carrier corresponding to channel 36 in the frequency range of the second IF signal, it is also possible to improve the tuner's performance by placing a trap for rejecting the sound carrier of the RF signal corresponding to channel 36 in the signal path prior to first mixer 17 as is indicated by 607.75 mHz trap 43 connected in shunt with the input of first mixer 17. When it is desired to tune UHF channel 36, trap 43 is disabled in response to a switching control signal generated by a decoder 45 which determines when the binary representation of the selected channel number provided by channel selector 35 represents 36. Since trap 43 has a relatively wide rejection band, due to the fact that it is difficult to make traps in the UHF range with narrow rejection bands, trap 43 is also disabled by decoder 45 when other channels near channel 36, e.g., channels 31–43, are selected to be tuned. Since trap 43 is present for channels other than channels 31–43, and has a relatively wide rejection band, the RF signal for channel 38 is also beneficially rejected for these channels.

Blocks 11–15 of the double conversion tuner shown in FIG. 1 may be constructed in similar fashion to corresponding structures disclosed in U.S. patent application Ser. No. 294,133, entitled "Multiband Tuning System for a Television Receiver" filed in name of G. E. Theriault on Aug. 19, 1981, issued as U.S. Pat. No. 4,408,348 and assigned to the same assignee as the present invention. First intermediate filter section 25 may comprise a double tuned circuit, an amplifier and a triple tuned circuit coupled in cascade. Second mixer 27 may simply comprise a transistor which receives both the first intermediate signal and the second local oscillator signal at its base electrode and produces their frequency difference and sum products at its collector electrode. As earlier noted second IF filter section 31 is of conventional design and may for example comprise the IF filter section of a CTC-108 television receiver chassis commercially available from RCA Corporation, Indianapolis, Ind., and described in RCA Service Data File 1982-CTC 108.

Figure 3:
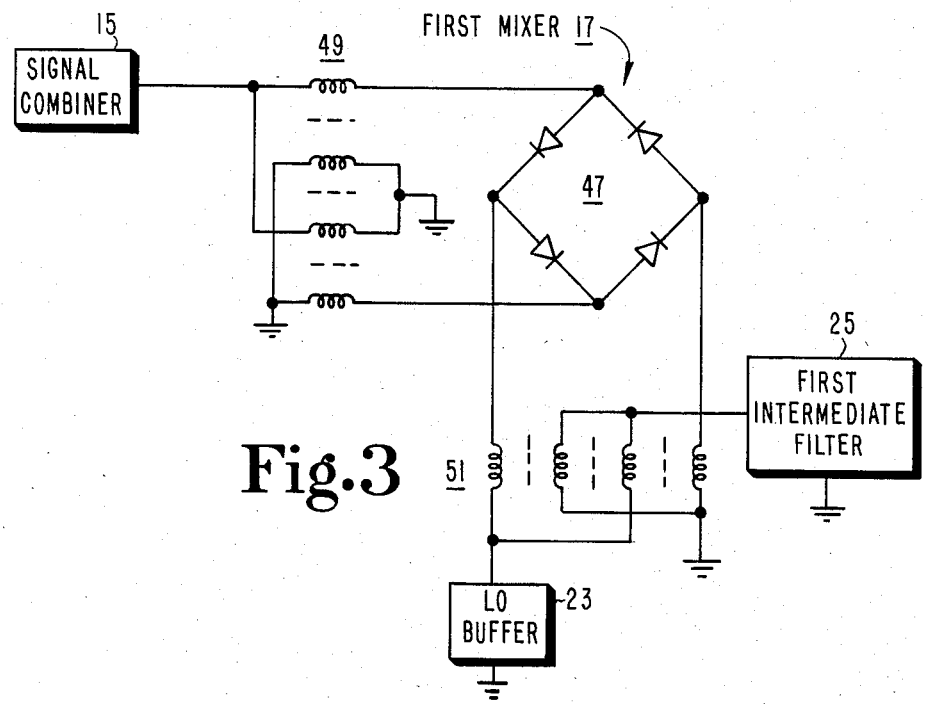
FIGS. 3, 4 and 5 are schematics in datailed circuit diagram form of implementations of various portions of the tuning system, shown in block form in FIG. 1.

An implementation of doubly balanced mixer 17 is shown in FIG. 3. As is shown, the doubly balanced mixer 17 simply comprises a diode bridge 47 as the mixing element, a first balun 49 for coverting the unbalanced output signal of signal combiner 15 to balanced, oppositely phased output signals which are coupled to a first set of differential input points of diode bridge 47, and a second balun 51 for converting the unbalanced output signal of LO buffer 23 to balanced, oppositely phased output signals which are coupled to a second set of differential input points of diode bridge 47. The second set of input points also serve as output points and balun 51 also serves to convert the balanced output signals of diode 47 taken at the second set of input points to an unbalanced output signal which is coupled to first intermediate filter section 17.

Figure 4:
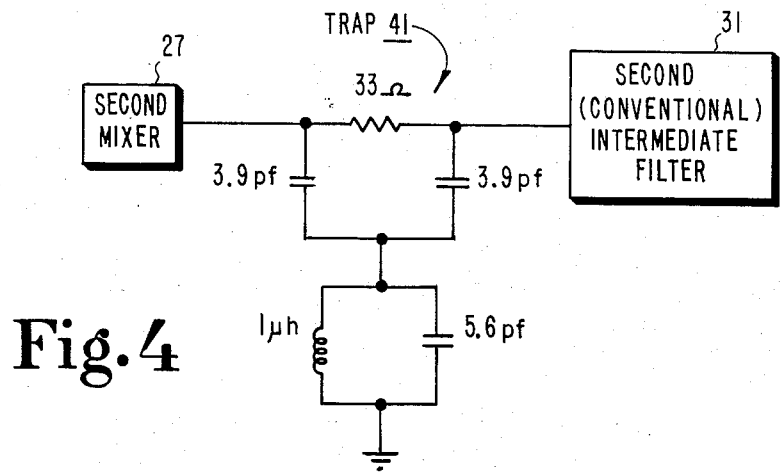

An implementation of tap 41 is shown in FIG. 4 and simply comprises a "bridged-T" arrangement. Typical values are shown when the trap is designed for maximum attenuation of 40.75 mHz.

Figure 5:
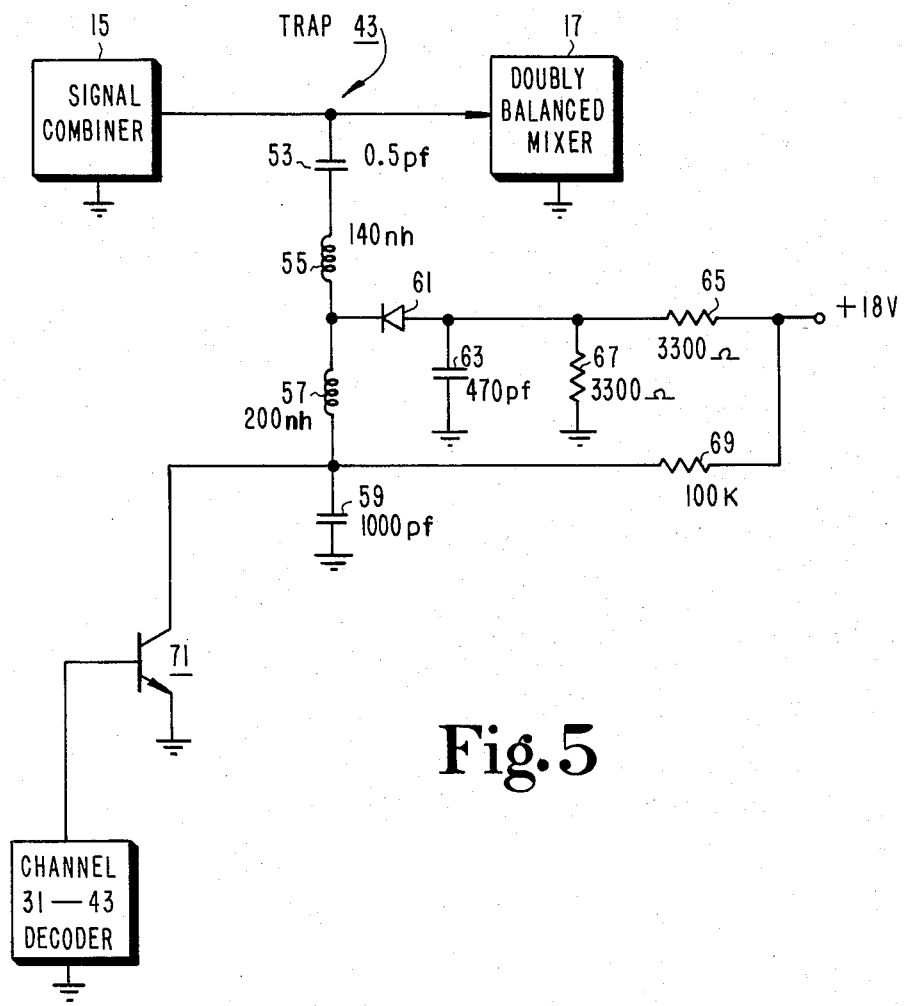

An implementation of selectively enabled trap 43 is shown in FIG. 5. As shown, it includes a capacitor 53, inductors 55 and 57, and a capacitor 59 connected in series between the RF signal input of doubly balanced mixer 17 and signal ground. A switching diode 61 and a bypass capacitor 63 are connected in series between the junction of inductors 55 and 57 and signal ground. Resistors 65 and 67 as well as inductor 57 bias the anode of diode 61 positively. A resistor 69 is the load resistor for a switching transistor 71 the collector of which is connected through inductor 57 to the cathode of diode 61 and the base of which is connected to the output of channel decoder 45. When a UHF channel other than one of UHF channels 31–43 is selected the control signal produced at the output of decoder 45 is at a high voltage level, transistor 71 and diode 61 are conductive. In this condition, a series resonance circuit including capacitor 53 and inductor 55 is connected in shunt with the RF signal input of doubly balanced mixer 17. The values of capacitor 53 and inductor 55 are selected to provide maximum attenuation substantially at the sound carrier frequency of the RF signal corresponding to channel 36. As earlier noted, the rejection band of trap 43 is relatively broad, for example, approximately 15 mHz wide with the values shown. Accordingly, when a UHF channel between UHF channels 31 and 43 is selected, inclusively, the control signal is at a low logic level, transistor 71 and diode 61 are non-conductive. In this condition a series tuned circuit including capacitor 53, inductors 55 and 57, and capacitor 59 is connected in shunt with the RF input of doubly balanced mixer 17. The values of inductor 57 and capacitor 59 are selected with respect to the values of capacitor 53 and inductor 55 so that the trap frequency is shifted below the UHF range, for example, to a frequency of approximately 386 mHz. Typical component values for trap 43 are shown in FIG. 5.

The use of a PLL as tuning voltage generator 37 is desirable since it stabilizes first local oscillators 19 and 21 against drift. This is desirable to provide the frequency relationships shown in FIG. 2 by which the picture carrier of the RF signal associated with channel 38 and the sound carrier of the RF signal associated with channel 36 are inhibited from interfering with the tuning of other channels. In this respect, it is also desirable to stabilize second local oscillator 29 against drift. This may be accomplished, e.g., by making second local oscillator 41 crystal controlled, a SAW (surface acoustic wave) resonator or by applying an AFT (automatic fine tuning) voltage representing the deviation, if any, between the actual picture carrier frequency of the second intermediate signal and its desired or nominal value, e.g., 45.75 mHz, to second LO 41. These and other modifications are intended to be within the scope of the present invention defined by the following claims.

What is claimed is:

1. A tuning arrangement capable of tuning broadcast UHF and broadcast and cable VHF RF television signals, each including respective modulated picture and sound carriers, in a substantially continuous frequency range corresponding to respective television channels provided at respective UHF and VHF inputs comprising:

first frequency converter means coupled to said UHF and VHF inputs for converting the RF television signal corresponding to a selected channel to a first intermediate signal in the RF frequency range of a predetermined UHF television channel which is not used for the broadcast transmission of television information;

RF coupling means coupled to said UHF and VHF inputs for coupling said UHF and VHF RF television signals to said first frequency converter;

first filter means;

said RF coupling means and said first frequency converter means being susceptible to coupling the RF signals corresponding to the upper and lower adjacent UHF television channels immediately above and below, respectively, said unused UHF television channel to said first filter means even when another one of said television channels is selected;

said first filter means having a passband filter characteristic selected to pass the picture and sound carriers of said first intermediate signal corresponding to said selected channel but to relatively attenuate the picture carrier of said RF signal corresponding to said upper adjacent UHF television channel for producing a filtered first intermediate signal;

second frequency converter means for converting said filtered first intermediate to a second intermediate signal in a predetermined IF frequency range; and second filter means having a passband characteristic selected to pass the picture and sound carriers of said second filtered intermediate signal corresponding to said selected television channel but to relatively attenuate said sound carrier of said RF signal corresponding to said lower adjacent UHF television channel in frequency as converted to said predetermined IF frequency range by said second frequency conversion means for producing a second filtered intermediate signal.

2. The apparatus recited in claim 1 wherein:
said first converter means includes a doubly balanced mixer.

3. The apparatus recited in claim 2 wherein:
said first converter means also includes first local oscillator means for generating a first local oscillator signal having a frequency set according to said selected channel; and said doubly balanced mixer is coupled to said UHF and VHF inputs by said RF coupling means and to said first local oscillator means for producing said first intermediate signal as the difference frequency product of said first local oscillator signal and said RF signal corresponding to said selected channel; and said second converter means includes second local oscillator means for generating a second local oscillator signal; and a second mixer coupled to said first filter means and to said second local oscillator means for producing said second intermediate signal as the difference frequency product of said first intermediate signal and said second local oscillator signal.

4. The apparatus recited in claim 3 wherein:
said unused UHF channel has a frequency range substantially between 608 and 614 mHz, inclusively.

5. The apparatus recited in claim 4 wherein:
selective trap means is coupled between said UHF input and said first converter means for selectively attenuating at least said sound carrier of said RF signal of said lower adjacent UHF television channel immediately below said unused UHF television channel when said lower adjacent UHF television channel is not selected.

6. The apparatus recited in claim 5 wherein:
said selective traps means selectively attenuates RF signals in a range of frequencies surrounding the frequency of said sound carrier of said RF signal corresponding to said lower adjacent UHF television channel immediately below said unused UHF television channel when the selected channel is not in a predetermined range of UHF channels surrounding said lower adjacent UHF television channel.

7. The apparatus recited in claim 4 wherein:
the frequency of said first local oscillator signal is set so that the frequency of said picture carrier of said first intermediate signal corresponding to said selected channel is between 613 mHz and 612.75 mHz, inclusively.

8. The apparatus recited in claim 7 wherein:
the frequency of said second local oscillator is set so that the frequencies of said picture and sound carriers of said second intermediate signal corresponding to said selected channel are substantially equal to 45.75 mHz and 41.25 mHz, respectively; and a trap is coupled to said second filter means for attenuating signals at a frequency substantially equal to the frequency difference between the frequency of said sound carrier of said RF signal corresponding to said lower adjacent UHF television channel immediately below said unused UHF television channel and the frequency of said second local oscillator signal.

9. The apparatus recited in claim 7 wherein:
the frequency of said first local oscillator signal is set so that the frequency of said picture carrier of said first intermediate signal corresponding to said selected channel is substantially equal to 612.75 mHz.

10. The apparatus recited in claim 9 wherein:
the frequency of said second local oscillator is set so that the frequencies of said picture and sound carriers of said second intermediate signal corresponding to said selected channel are substantially equal to 45.75 mHz and 41.25 mHz, respectively; and
a trap is coupled to said second filter means for attenuating signals at a frequency substantially equal to 40.75 mHz.

11. A television tuning apparatus capable of tuning broadcast and cable television RF signals, each including picture and sound carriers, corresponding to respective channels, comprising:
channel selection means for generating a tuning control signal and controlling its magnitude in accordance with the selection of a channel;
a UHF input for receiving broadcast television signals in the UHF RF range;
a VHF input for receiving broadcast and/or cable television signals in the VHF RF range;
UHF RF filter means coupled to said UHF input for selecting the UHF RF signal corresponding to said selected channel in response to the magnitude of said tuning control signal;
VHF RF filter means coupled to said VHF input for selecting the VHF RF signal corresponding to said selected channel in response to the magnitude of said tuning control signal;
UHF local oscillator means for generating a UHF local oscillator signal having a frequency corresponding to said selected channel in response to the magnitude of said tuning control signal;
VHF local oscillator means for generating a VHF local oscillator signal having a frequency corresponding to said selected channel in response to the magnitude of said tuning control signal;
a doubly balanced mixer coupled to said UHF and VHF RF filter means and to said UHF and VHF local oscillator means for producing a first intermediate signal having a picture carrier corresponding to the picture carrier of said selected channel in the frequency range of a UHF channel which is not used for the transmission of television signals;
first intermediate filter means for filtering said first intermediate signal to produce a first filtered intermediate signal;
third local oscillator means for generating a third local oscillator signal;
second mixer means coupled to said first intermediate filter means and to said third local oscillator means for producing a second intermediate signal with a picture carrier corresponding to said picture carrier of said selected channel in a predetermined IF frequency range; and
second intermediate filter means for filtering said second intermediate signal to produce a filtered second intermediate signal including a trap at a frequency substantially equal to the difference between the frequencies of the sound carrier of the RF signal corresponding to said lower adjacent channel next to said unused UHF channel and the frequency of said second local oscillator signal.

12. The apparatus recited in claim 11 further including:
selective filter means coupled between said UHF input and said doubly balanced mixer for selectively attenuating at least an RF signal having a frequency substantially equal to said frequency of said sound carrier of the RF signal corresponding to said lower adjacent channel next to said unused UHF channel.

13. The apparatus recited in claim 11 wherein:
said unused UHF channel has an RF frequency range between 608 and 614 mHz, inclusively.

14. The apparatus recited in claim 13 wherein:
said picture carrier of said first intermediate signal corresponding to said selected channel has a frequency between 612.75 and 613 mHz, inclusive.

15. The apparatus recited in claim 14 wherein:
said picture carrier of said second intermediate signal corresponding to said selected channel has a frequency substantially equal to 612.75 mHz.

16. A double conversion tuner for tuning RF television signals corresponding to respective channels in the VHF and UHF ranges which are substantially contiguous ranges, comprising:
a UHF antenna input to which a UHF antenna may be connected;
a VHF input to which a VHF antenna or a cable distribution network may be connected;
channel selection means by which a user may select a desired channel;
RF filter means coupled to said UHF and VHF inputs for selecting the RF signal corresponding to said selected channel;
first local oscillator means for generating a first local oscillator signal;
a doubly balanced mixer responsive the RF and local oscillator signals corresponding to the selected channel for producing a first intermediate signal, said first local oscillator means controlling the frequency of said first local oscillator signal so that said first intermediate signal has picture and sound carriers corresponding to said selected channel in the frequency range between 608 and 614 mHz;
said RF filter means and said doubly balanced mixer being susceptible to coupling the RF signals corresponding to the upper and lower adjacent UHF channels immediately above and below 608 and 614 mHz, respectively, thereby contaminating said first intermediate signal;
first intermediate filter means having a bandpass characteristic approximately between 608 and 614 mHz for filtering said first intermediate signal to pass said picture and sound carriers corresponding to said selected channel and to relatively attenuate the picture carrier of said RF signal corresponding to said upper adjacent UHF channel immediately above 614 mHz to produce a first filtered intermediate signal;
second local oscillator means for generating a second local oscillator signal;
a second mixer responsive to said first filtered intermediate signal and said second local oscillator signal for producing a second intermediate signal, said second local oscillator means controlling the frequency of said second local oscillator signal so that second intermediate signal has a picture carrier corresponding to said selected channel at a predetermined IF frequency; and
second intermediate signal filter means having a predetermined passband characteristic in a predetermined IF frequency range including said predetermined IF frequency for filtering said second intermediate signal to pass said picture and sound carriers corresponding to said selected channel and to relatively attenuate a signal with a frequency substantially equal to the difference between the frequency of said sound carrier of said RF signal corresponding to said lower adjacent UHF channel immediately below 608 mHz to produce a filtered second filter intermediate signal; and demodulator means for generating a baseband video signal from said picture carrier of said second filtered intermediate signal.

17. The apparatus recited in claim 16 further including:

trap means coupled to the signal path between said UHF antenna input and said double balanced mixer for attenuating said sound carrier of said RF signal corresponding to said lower adjacent UHF channel immediately below 608 mHz; and trap control means for disabling said trap means when said lower adjacent UHF channel immediately below 608 mHz is selected.

18. The apparatus recited in claim 16 wherein:

said second intermediate filter means includes a trap for attenuating a signal with a frequency substantially equal to difference between the frequency of said sound carrier of said RF signal corresponding to said lower adjacent UHF channel immediately below 608 mHz and the frequency of the second local oscillator signal.

19. The apparatus recited in claim 18 wherein:

said picture carrier of said first intermediate signal corresponding to said selected channel has a frequency between 612.75 and 613 mHz, inclusively.

20. The apparatus recited in claim 19 wherein:

the picture carrier of said first intermediate signal corresponding to said selected channel has a frequency substantially equal to 612.75 mHz.

* * * * *